(12) United States Patent
Laermer et al.

(10) Patent No.: US 7,285,228 B2
(45) Date of Patent: Oct. 23, 2007

(54) DEVICE AND METHOD FOR ANISOTROPIC PLASMA ETCHING OF A SUBSTRATE, A SILICON BODY IN PARTICULAR

(75) Inventors: Franz Laermer, Weil der Stadt (DE); Klaus Breitschwerdt, Filderstadt (DE); Bernd Kutsch, Konz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/506,457

(22) PCT Filed: Mar. 5, 2003

(86) PCT No.: PCT/DE03/00676

§ 371 (c)(1),
(2), (4) Date: Jan. 5, 2005

(87) PCT Pub. No.: WO03/075323

PCT Pub. Date: Sep. 12, 2003

(65) Prior Publication Data

US 2005/0126710 A1 Jun. 16, 2005

(30) Foreign Application Priority Data

Mar. 5, 2002 (DE) .................. 102 09 763
Oct. 23, 2002 (DE) .................. 102 49 350

(51) Int. Cl.
*C23F 1/00* (2006.01)
(52) U.S. Cl. .................. 216/67; 156/345.33
(58) Field of Classification Search .............. None
See application file for complete search history.

(56) References Cited

U.S. PATENT DOCUMENTS

| 5,273,609 | A | 12/1993 | Moslehi |
| 5,498,312 | A | 3/1996 | Laermer et al. |
| 5,888,907 | A | 3/1999 | Tomoyasu et al. |
| 6,042,687 | A | 3/2000 | Barnes et al. |
| 6,248,148 | B1 | 6/2001 | Faulmann et al. |
| 6,303,512 | B1 | 10/2001 | Laermer et al. |

FOREIGN PATENT DOCUMENTS

| DE | 42 41 045 | 5/1994 |
| DE | 198 26 382 | 12/1999 |
| DE | 199 33 841 | 2/2001 |
| DE | 199 33 842 | 2/2001 |
| DE | 199 57 169 | 6/2001 |
| DE | 100 51 831 | 5/2002 |
| EP | 1 062 679 | 12/2000 |
| GB | 2 327 382 | 1/1999 |
| JP | 63 239948 | 10/1988 |
| JP | 63 282275 | 11/1988 |
| JP | 2000 091320 | 3/2000 |
| WO | 00/36631 | 6/2000 |

*Primary Examiner*—Allan Olsen
(74) *Attorney, Agent, or Firm*—Kenyon & Kenyon LLP (57) ABSTRACT

A method and device for implementing the method for anisotropically plasma etching a substrate (e.g., silicon body). The device has a chamber and plasma source for generating a high-frequency electromagnetic alternating field and a reaction region for generating a plasma having reactive species, within the chamber, that is generated by the action of the alternating field on etching gas and passivation gas introduced at the same time but spatially separated from it. An arrangement defines at least one first zone acted on by the etching gas and at least one second zone acted on by the passivation gas in the reaction region. The device has a mixing region downstream of the reaction region in which the reactive species generated from the etching gas in the first zone and the reactive species generated from the passivation gas in the second zone are blended before they act on the substrate.

17 Claims, 9 Drawing Sheets

DEVICE AND METHOD FOR ANISOTROPIC PLASMA ETCHING OF A SUBSTRATE, A SILICON BODY IN PARTICULAR

FIELD OF THE INVENTION

The present invention relates to a device and a method for anisotropic etching of a substrate, a silicon body in particular, using a plasma source.

BACKGROUND INFORMATION

When silicon is subjected to high-rate anisotropic plasma etching using the maximum possible mask selectivity and the best possible profile control, for example in the manner referred to in German patent document no. 42 41 045, a stable passivation which can easily be removed again from the etching base of the structures to be etched while maintaining the mask selectivity, i.e., as a result of ion bombardment with a low energy input per unit of time, has to be applied to the side walls of the structures to be etched. At the same time, a high density of etching species has to be provided for removing the silicon from the etching base.

Fluorine radicals from fluorine-donating etching gases such as $SF_6$, $NF_3$, $ClF_3$, $BrF_3$, etc., which are broken up in a high-density plasma, are conventionally used as the etching species. As the passivation species, primary candidates are Teflon-forming monomers from passivation gases such as $C_4F_8$, $C_3F_6$ or other fluoro(hydro)carbons which may have a low ratio of fluorine to carbon, such as 2:1 or less, which can also be broken up in a high-density plasma.

The Teflon-forming monomers form a side wall protective film which prevents an etching attack on the side wall and gives rise to the desired anisotropy of the etching, while an ion bombardment directed primarily towards the etching base ensures that the Teflon-like protective films there may be broken down again so that the etching base remains substantially free of the protective film, while the fluorine radicals, acting as the etching species, etch the exposed silicon surfaces on the etching base.

If the attempt is made to supply a plasma having fluorine-donating etching gases and polymer-forming passivation gases at the same time and to break these up therein in order to generate a high density of etching species and passivation species at the same time, then a damaging mutual influence and undesirable recombination of both species is observed; this means that instead of polymer films being formed on the side walls and efficient etching being carried out at the etching base, the fluorine radicals and the polymerizable Teflon formers react to form saturated fluorine compounds which are largely inactive with respect to silicon.

To take account of this problem, U.S. Pat. No. 5,498,312 refers to using high plasma density in particular to counter the undesirable recombination reaction with a correspondingly higher production rate of both species by way of a high density of both these inherently incompatible species. However, this approach results, referring to the Si etching rate achievable per kilowatt of plasma output, in relatively inefficient processes and is problematic with regard to profile control and the reactor contamination with polymers which occurs at the same time and which is primarily caused by the required excess of passivation gas compared with the etching gas.

An alternative approach is referred to in U.S. Pat. No. 6,303,512, where etching and passivation gases which are more compatible with one another are used. Thus, in that case, $SF_6$ or $ClF_3$ is used as the fluorine-donating etching gas, while passivation is achieved using oxygen and silicon tetrafluoride by depositing a protective film similar to $SiO_2$ on the sidewalls of the structures to be etched. Fluorine radicals do not react or recombine with oxygen radicals or $SiF_4$, so etching and passivation gases may be used as a steady-state gas mixture without problems. However, it is disadvantageous here that side wall passivation is brought about by comparatively hard films similar to $SiO_2$ which require a higher energy input through a directed ion bombardment in order to be capable of being broken through on the etching base, and this greatly reduces mask selectivity. The etching process according to U.S. Pat. No. 6,303,512 therefore has to operate while taking into account the limits in view of mask selectivity, which increases the risk of undesirable roughness in the etching base and so-called "grassing". Passivation with the aid of $SiO_2$ also has the disadvantage that inhomogeneities in the energy input to the etched substrate bring about much more pronounced disruptive effects than in the case of Teflon-like films.

The German patent document no. 42 41 045 is directed to solving the problem of the "unpeaceful coexistence" between Si-etching fluorine radicals and monomers forming Teflon-like films by separating the generation thereof in time, i.e., alternating the two processes. In this way, Teflon-like films formed during so-called "passivation cycles" are removed again during subsequent "etching cycles" which are in themselves isotropic and are re-deposited lower down in the trenches created, so that a localized protective action is produced, by the entrainment of the side wall film down into the trenches. The problem here is the limited plasma stability during gas change, where changes in impedance in the plasma may result in a mismatch of the high-frequency or microwave radiation supplied, which gives rise to reflected output until the plasma discharge begins ("flickering"). Moreover, this process sometimes involves individual cases in which it may not be possible to make the sidewalls of the trenches created completely smooth, which may be disadvantageous for example for optical applications using mirror surfaces.

An object of the exemplary embodiment and/or exemplary method of the present invention was to provide a method for the anisotropic high-rate etching of a semiconductor substrate such as silicon using a plasma and a device suitable for implementing the method, by which the disadvantages of German patent document no. 42 41 045 such as process instabilities or transient phenomena temporarily associated therewith may be overcome and sidewalls of the trenches created which are as smooth as possible without fluting in the walls may always be achieved.

SUMMARY OF THE INVENTION

The exemplary device according to the present invention and the exemplary method according to the present invention have the advantage that a constant change between the etching gas and the passivation gas within the plasma etching device may be dispensed with, thus avoiding the process instabilities associated therewith and overall even smoother sidewalls of the trenches created are achieved. At the same time, the advantages of the method according to German patent document no. 42 41 045 are maintained and the process parameters and installation configurations developed for it may still be used, apart from the manner of defining the etching gas and passivation gas zones which are provided in a novel manner. Consequently, the exemplary device according to the present invention may easily be integrated into an existing installation, and the exemplary method according to the present invention may still be followed based on the method according to German patent document no. 42 41 045, without major investment or the development of completely new process parameters.

The exemplary method of the present invention makes provides for achieving vertical and very smooth etching profiles, in particular in silicon, in a continuous process, at very high etching rates. In particular, visually smooth sidewalls may be produced, as required for optical components such as micro-mirrors. At the same time, a higher level of structuring accuracy is achieved with reduced critical dimension loss, which will become more and more important for microsensors in future.

Thus, it is advantageous if a certain proportion of oxygen is added to the etching gas $SF_6$ flowing through the etching gas zones used to generate the fluorine radicals, as in German patent document no. 198 26 382. This added oxygen does not bring about any damaging influence on the process but ensures that sulfur compounds react to $SO_2$ and similar volatile substances instead of being precipitated out as a long-chain polymer-like sulfur film in the outgoing gas region of the plasma etching system.

It is furthermore advantageous, in particular when ceramic materials are used for the reactor of the plasma etching device, if a relatively small quantity of oxygen is also added to the passivation gas flowing through the passivation gas zones used to generate Teflon-forming monomers, in order to suppress the creation of graphite particles which could act as damaging micro-masks on the semiconductor substrate to be etched, which is typically in the form of a silicon wafer. For the oxygen portion in the passivation gas to remain harmless with respect to the process, the oxygen quantities used there are typically restricted to approximately 10% to 20% of the oxygen value added or capable of being added to the etching gas. When quartz glass or another glass is used as the reactor material, this addition of oxygen is not usually necessary, since no graphite particles form on glass surfaces because of the chemically bonded oxygen there.

In addition, it is advantageous in particular if the plasma etching device is used in combination with a magnetic ion discriminator, as discussed in German Patent No. 199 33 841 and in particular the application based on it, German patent document no. 100 51 831. As a result of the method explained in this publication, of setting up opposing magnetic coil currents below the actual plasma generation zone or plasma source, uniform etching results in particular are achieved over the entire substrate surface. Moreover, with the inductively coupled plasma which may be used in the context of the exemplary embodiment and/or exemplary method of the present invention, it may be advantageous if a balanced feed to the inductive coil is used, as in European Patent document no. 1 062 679.

Finally, it is advantageous if, while the above-explained plasma etching process is implemented, the process parameters are altered continuously or in steps; examples are the process pressure, the plasma output, the substrate bias output, the substrate bias voltage, the process gas flows or the substrate temperature. In particular, it is advantageous if the ratio of passivation gas flow to etching gas flow is varied continuously or in discrete steps during the etching process, as in U.S. Pat. No. 6,284,148 for a method of the type referred to in German patent document no. 42 41 045.

Moreover, it is advantageous that available refinements of the method of German patent document no. 42 41 045, whether of the process engineering or plant engineering type, may be combined to a very great extent with the etching device described in the context of the exemplary embodiment and/or exemplary method of the present invention and the etching process explained here. Thus, in particular the double-pulse technique of German patent document no. 199 33 842 for the substrate bias voltage or substrate bias output, which is primarily used to suppress the formation of pockets in the region of a dielectric interface acting as an etch stop, may also be integrated into the present method.

BRIEF DESCRIPTION OF THE DRAWINGS

FIG. 2a shows a second embodiment of the insert body, an alternative to that in FIG. 1a.

FIG. 3a shows a further embodiment of the insert body, an alternative to those in FIG. 1a or 2a.

FIG. 3b shows a section through FIG. 3a.

FIG. 7 shows an alternative exemplary embodiment to that in FIG. 5a.

DETAILED DESCRIPTION

The exemplary device according to the present invention and the exemplary method according to the present invention, which may be implemented using the method, have the principal aim, instead of providing a separation in time between generating an etching species (F) which etches silicon, for example, and a passivation species ($C_nF_{2n}$) forming Teflon-like films, as from German patent document no. 41 42 045, to provide physical separation between the locations where the two species in the plasma etching system are generated in order to be able to generate them at the same time and as far as possible without damaging interactions between them. However, it should be stressed that time separation as well as physical separation may be achieved; i.e., the exemplary embodiment and/or exemplary method according to the present invention may also be combined with the procedure according to German patent document no. 42 41 045 where required. However, this is not typically necessary.

Specifically, at least one etching gas zone 23 is first provided in plasma etching system 70, within the plasma source, i.e., in a reaction region 20, and a fluorine radical-donating etching gas such as $SF_6$ flows substantially or mainly through this etching gas zone 23, i.e., the plasma-induced generation of fluorine radicals takes place at least largely therein.

In addition, within the plasma source there is provided in reaction region 20 at least one passivation gas zone 22 through which a passivation gas such as $C_4F_8$ (octafluorocyclobutane), $C_3F_6$ (hexafluoropropene), $C_4F_6$ (hexafluoro- 1,3-butadiene) or $C_5F_8$ (octafluoro 1,3-pentadiene or octafluorocyclopentene), which donates Teflon-forming monomers, flows substantially or mainly; i.e., the plasma-induced generation of Teflon-forming monomers takes place at least largely therein.

Finally, plasma etching system 70 has, between the plasma source and substrate 59 to be etched, which is typically a silicon wafer, a mixing region 21, which is situated as far as possible outside the plasma source or etching gas zone 23 and passivation gas zone 22. Once a density of etching species and passivation species as high as possible has first been generated in etching gas zone 23 and passivation gas zone 22, at least largely independently of one another, a mixing as thorough as possible of both species takes place in this mixing region 21 on their way to substrate 59 to be etched.

This homogeneous mixing is required in order to achieve a homogeneous composition of the reaction gas at the site of substrate 59, which is a precondition for a homogeneous etching result over the entire substrate surface. On the other hand, during the mixing a recombination of the two types of species occurs a priori with mutual extinction, which has been explained as being undesirable.

However, it has astoundingly been found that this homogeneous mixing, which according to the exemplary embodiment and/or exemplary method of the present invention takes place at least largely only outside the plasma source or etching gas zone(s) 23 and passivation gas zone(s) 22, where the gas mixture is already expanding towards substrate electrode 60 and substrate 59 situated on it, has substantially less effect on the undesirable recombination of the two types of species than is the case in the related art. In particular, it has been shown that it is not so much the presence of a high density of both types of species that is disruptive with respect to the undesirable recombination but instead, the simultaneous presence of both starting substances generated at the same location, namely in the region of the plasma source or in reaction region 20. There, in the case of a gas mixture, the presence of the etching gas alters the plasma conditions such that it is no longer possible to generate passivation species efficiently, which in the related art makes it necessary to provide a considerable excess of passivation gas, with the result that the overall etching process has a considerably slower etching rate.

If, in contrast, a high density of fluorine radicals and monomers which form Teflon-like films is generated from the starting substances as independently of one another as possible, which is achieved by physical separation into separate zones, namely etching gas zone 23 and passivation gas zone 22, then the confluence of the two types of species outside these zones 22, 23 and hence in particular outside the plasma source is no longer so disruptive. Consequently, only once a high density of passivation species and etching species has been formed independently of one another, and in particular the chain length and hence the mass of the passivation species, i.e., the Teflon-like precursor chains of radical nature which are formed from Teflon-forming radicals are already relatively great, the recombination reaction is no longer as relevant as it would be if both types of species were already competing in the plasma during the generation process, having an effect on the plasma conditions such as electron density and electron temperature. The situation furthermore becomes less problematic the longer the Teflon-like precursor chains have become before they enter the mixing region, i.e., the more radical chains of the form $(CF_2)_n$, which are as long as possible and which may be branched, have formed.

Figure 1A:
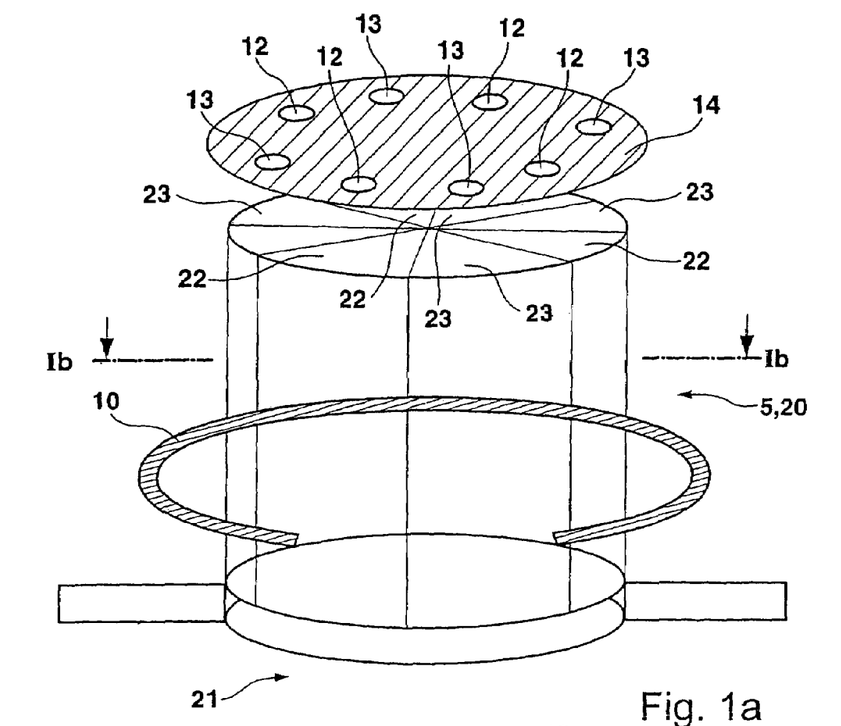
FIG. 1a shows a schematic diagram of a first embodiment of an insert body which is placed on the chamber of the plasma etching system.

FIG. 1a shows, diagrammatically and in perspective view, a first exemplary embodiment of the invention. To this end, first of all according to FIG. 6 or FIG. 8, a chamber 53 of plasma etching system 70 in which the etching takes place is provided with or connected to an inductively coupled plasma source acting on reaction region 20, as for example from German patent document no. 199 33 841. Furthermore, reaction region 20 is divided at least in certain regions into a plurality of zones 22, 23, which are at least largely separated from one another for a gas using an insert body 5 which is star-shaped in top view and which from a spatial point of view may have a cylindrical surface as its envelope.

A plurality of etching gas zones 23 and passivation gas zones 22 are individually provided in reaction region 20 on which the plasma source acts, and an etching gas associated with etching gas zones 23 or a passivation gas associated with passivation gas zones 22 flows through these zones. Etching gas zones 23 and passivation gas zones 22 may alternate as seen in top view of insert body 5. The gas associated with the respective individual zones 22, 23 is supplied through corresponding gas inlets or gas entry openings 12, 13 in the form of bores in a cover plate 14 of insert body 5, with the result that etching gas $SF_6$ may be supplied to etching gas zones 23 and passivation gas $C_4F_8$ may be supplied to passivation gas zones 22 through these bores at the same time without these gases being thoroughly mixed in the region in which the plasma is generated or in the plasma source.

Figure 1B:
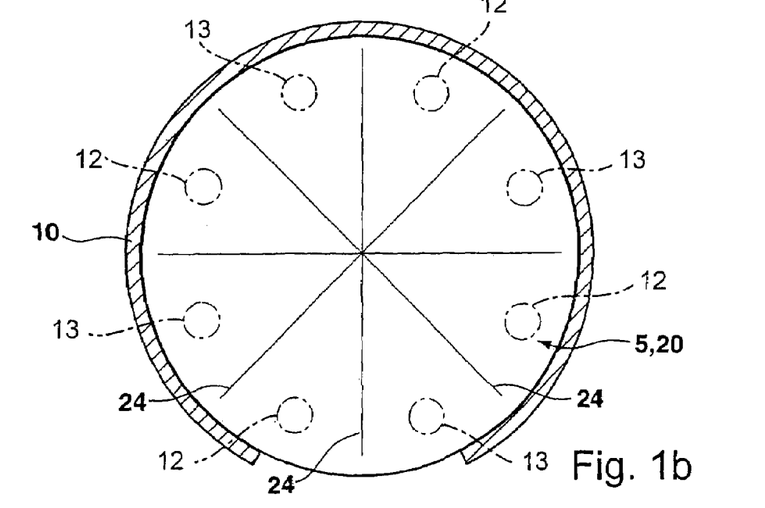
FIG. 1b shows a section through FIG. 1a along the section plane shown in the drawing.

FIG. 1b shows the star-shaped structure of insert body 5 in top view onto a sectional plane parallel to one of the base surfaces of insert body 5, a coil 10 surrounding insert body 5 located in the plasma generation region of plasma etching system 70 and generating the desired plasma in the interior of insert body 5 as a result of inductive coupling also being indicated.

Insert body 5 does not necessarily have an external, for example cylindrical, outer surface, since this may also be formed by the wall of chamber 53 or a reactor placed on chamber 53 in the region of insert body 5 or integrated therewith. To that end, insert body 5 is dimensioned accordingly and is matched to the diameter of chamber 53 or of the reactor and inserted there or welded in place.

However, insert body 5 may have, in addition to walls 24 extending from its center in the shape of a star and defining etching gas zones 23 and passivation gas zones 22, an external outer wall 44 which forms the outer surface and is typically cylindrical or tubular, so that insert body 5 also defines laterally closed etching gas zones 23 and passivation gas zones 22 when viewed by itself, i.e., even before it is inserted into plasma etching system 70. Although this embodiment is more complex, it makes insert body 5 less dependent on the geometry of plasma etching system 70 and so also more versatile in its application.

The total gas flow of the etching gas or etching gas mixture and the total gas flow of the passivation gas or passivation gas mixture in insert body 5 is monitored using conventional mass flow regulators, the particular total gas flow may be distributed evenly over equivalent zones 22, 23. As an alternative, it is also possible to associate with each of zones 22, 23 a separate mass flow regulator which in each case controls the quantity of gas supplied to these zones 22, 23 individually.

In the example described, the plasma is excited by coil 10, which surrounds the reactor of plasma etching system 70. This coil 10 has one or a plurality of windings and may be supplied with power in a balanced manner in the way referred to in European Patent document no. 1 062 679.

Igniting the plasma in the different zones 22, 23 induced in regions by insert body 5 is unproblematic, since coil 10 is directly adjacent to each of these zones 22, 23 and the electrical fields penetrating into the volume provide sufficient pre-ionization to build up the desired inductive plasma mode.

If an insert body 5 made of quartz glass is used, the ultraviolet radiation occurring additionally ensures that the plasma ignites evenly in all zones 22, 23 as soon as only one zone 22, 23 has ignited and emits UV radiation, i.e., in this case further ignition resulting from UV pre-ionization is achieved independently of any electrical action.

Insert body 5 may be made of quartz glass and chamber 53, or the reactor placed on chamber 53, is made of ceramic; insert body 5 should simply be set up in chamber 53, i.e., in the reactor and be matched to its geometry as well as possible or welded to it.

No high demands are placed on the sealing or gas impermeability between individual zones 22, 23. In particular, it is sufficient if in each case at least most of the gas flowing through the particular zone 22, 23, whether etching gas or passivation gas, is of the type concerned, i.e., etching gas or passivation gas. However, the structure may be such that no or only a negligible amount of mixing of the etching gas and passivation gas takes place in the region of insert body 5 or in reaction region 20. It should be emphasized, however, in this connection that it is not or it may not be possible to prevent mixing of this kind completely and instead, it is even desirable especially in the lower region of insert body 5 facing substrate 59 to be etched, where it is open.

Zones 22, 23 of the insert body are even in number in the example described, being, for example, six or eight to twelve in number to achieve a homogeneous etching result.

Accordingly, insert body 5 is then formed by a six-point, eight-point or ten-point star, which is inserted into the actual reactor or chamber 53 of plasma etching system 70.

Below the plasma source, which in the example described may also be designated as an inductively coupled multiple-pole plasma source, the etching gas and the passivation gas broken up by the plasma in zones 22, 23, respectively, emerge and are thoroughly mixed in mixing region 21 on their way to substrate electrode 60 and substrate 59 situated on it.

Figure 2A:
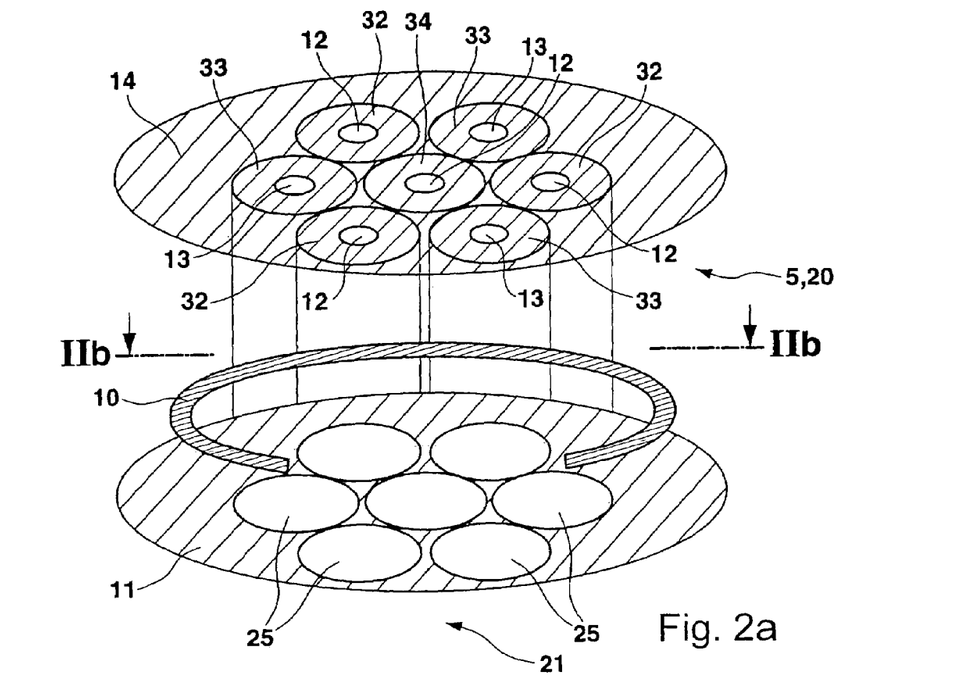

As a second exemplary embodiment, FIG. 2a shows an advantageous form in particular of the division into regions of the interior of plasma etching system 70 in reaction region 20 into etching gas zones 23 and passivation gas zones 22 in order to generate etching species and passivation species in spatially separated locations but which may be simultaneously, using insert body 5.

To this end, a plurality of tubes 32, 33, 34 are provided, the end face of each of them being sealed with respect to a cover plate 14 having corresponding bores as gas inlet openings 12, 13 and with respect to a base plate 11 having gas exit openings 25, or they are welded to them. Each of these tubes 32, 33, 34 defines a zone for generating etching or passivation species, i.e., it delimits an etching gas zone 23 or a passivation gas zone 22.

Around the system of tubes 32, 33, 34 which is formed in this way and which may have an at least approximately cylindrical envelope, there is once more laid coil 10 which generates the plasma required for the generation of the etching species and passivation species in these tubes.

Figure 2B:
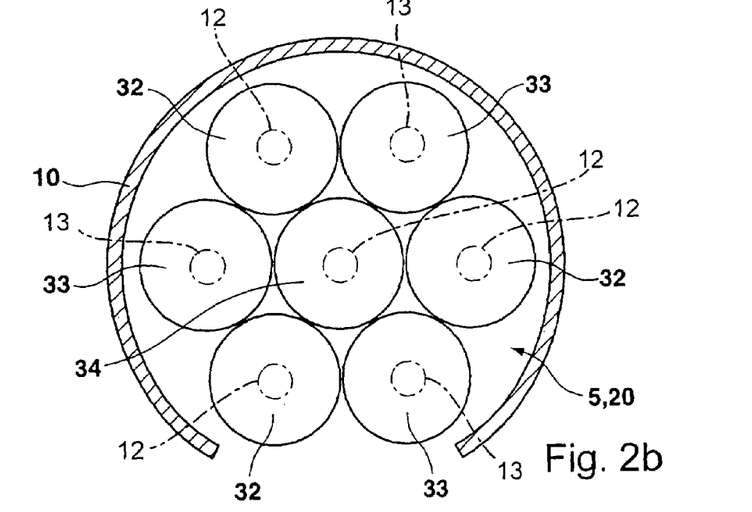
FIG. 2b shows a section through FIG. 2a along the section plane shown in the drawing.

In the system according to FIG. 2a, which is illustrated once again in FIG. 2b in section, seven tubes are used, the passivation gas may flow through the internal tube or central guide tube 34, while etching gas and passivation gas circulate alternately and thereto through the concentrically positioned external tubes or outer guide tubes 32, 33, i.e., each tube 33 through which the etching gas flows is adjacent to a tube 32 through which passivation gas flows. However, it should be emphasized that in principle the etching gas may also flow through internal tube 34.

The total number of tubes 32, 33, 34, which once again form a removable insert body 5 in the region of the plasma source or as an alternative may also be installed fixedly in plasma etching system 70, is uneven according to FIG. 2b and, given the context of achieving an etching result as homogeneous as possible, may be at least seven, or may be nine, eleven or more.

According to FIG. 2a or FIG. 2b, coil 10 surrounds the external envelope of tubes 32, 33, 34, once again a balanced power supply to the coil in accordance with European Patent document no. 1 062 679, which may be used.

The species produced, i.e., the fluorine radicals as the etching species and the $C_nF_{2n}$ radicals as the passivation species, in each case emerge at the open lower end of tubes 32, 33, 34, i.e., in the region of lower gas exit openings 25, into process chamber 53 and may thus first be thoroughly mixed in mixing region 21 on their way to substrate 59 to be etched.

With the configuration of guide tubes 32, 33, 34 according to FIG. 2a, it is in many cases necessary to make them of quartz glass, since bombardment with UV radiation is typically required in the interior of central guide tube 34 in order to ignite a plasma. Thus, since only external guide tubes 32, 33 border directly on inductive coil 10, and since it is usually only in these external tubes 32, 33 that inductive coil 10 is able to bring about a high enough electrical pre-ionization to ignite an inductively coupled plasma, pre-ionization by UV bombardment coming from surrounding external tubes 32, 33 is the decisive mechanism for igniting the plasma in central guide tube 34. In particular, the electrical fields generated by coil 10 are generally no longer sufficient for reliable ignition of the plasma in central guide tube 34. On the other hand, quartz glass has other advantageous properties as well, so its use may be desired in any case. For example, quartz glass is in particular a "clean" material which effectively suppresses the occurrence of graphite particles and other micro-masks during etching in etching system 70 and in particular on substrate 59 and which in particular has smooth surfaces which are ideal for plasma containment.

Figure 3A:
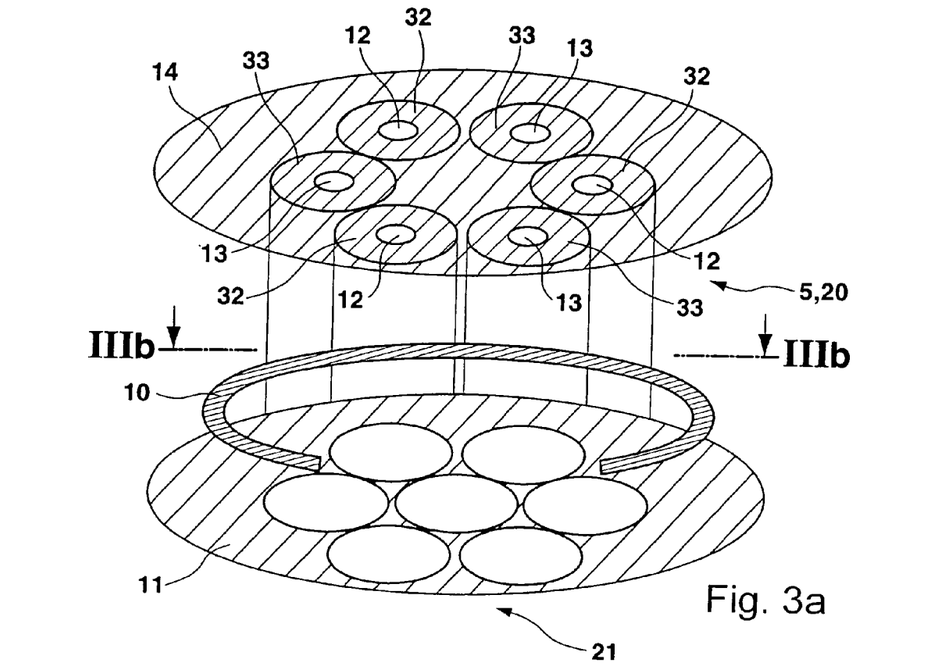
Figure 3B:
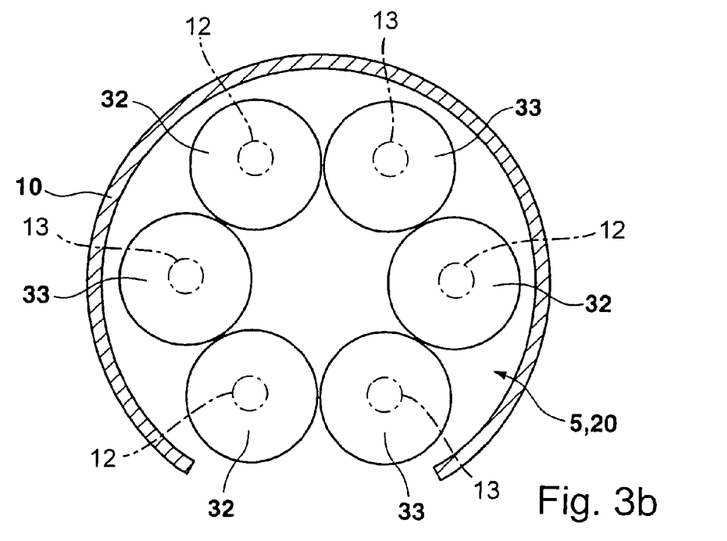

The configuration of guide tubes 32, 33 for etching and passivation gases according to FIGS. 3a and 3b, which show a further exemplary embodiment, may be provided for the use of ceramic tube materials and dispenses with central guide tube 34. Otherwise, the structure corresponds to that of FIGS. 2a and 2b.

In accordance with FIG. 3a, tubes 32, 33 are sealed with respect to cover plate 14 having gas entry openings 12, 13 and/or with respect to base plate 11 having lower gas exit openings 25, for example by O rings at their end faces. As an alternative, the end faces of tubes 32, 33 may also be welded to cover plate 14 and/or base plate 11 if the latter are made of quartz glass or permit a direct mechanical connection to tubes 32, 33.

The reactive species produced in etching gas zones 23 and passivation gas zones 22 emerge through lower gas exit openings 25 in the region of base plate 11 and are blended in mixing region 21 before acting on substrate 59 to be etched. For this purpose, lower gas exit openings 25 may have a diameter corresponding to the internal diameter of the respective tubes 32, 33, 34.

In a manner similar to the exemplary embodiments above, coil 10, which may be connected by a balanced coil feed to a matching network in the manner according to European Patent document no. 1 062 679 is once again guided around the system of tubes 32, 33 according to FIGS. 3a and 3b, which may be situated concentrically around the center of plasma etching system 70 and also that of insert body 5. Because in this case, all of tubes 32, 33 are directly adjacent to coil 10, plasma ignition in the interior of the tubes 32, 33 occurs without problems by electrical/capacitive actions. Furthermore, the wall material of tubes 32, 33 may also be opaque to the UV range, which makes it possible to use ceramic wall materials. According to FIG. 3a, tubes 32, 33 may be even in number and should be at least eight in number.

Making tubes 32, 33 out of ceramic has the advantage over quartz glass that no wall etching takes place, and that ceramic in principle has an unlimited service life, whereas quartz glass has to be replaced from time to time because it is used up.

As an alternative to the inductively coupled plasma source used above, also suitable is a microwave source by which a plasma may be generated in reaction region 20 in etching gas zones 23 and passivation gas zones 22 or tubes 32, 33, 34 respectively associated with them by microwave radiation injected into them at a frequency of, for example, 2.45 GHz. For this purpose, the surfatron principle referred to in German patent document no. 42 41 045 may be used, i.e., microwave radiation injected into each of the tubes 32, 33, 34 by way of one or more microwave waveguides propagates in a boundary layer between its dielectric wall and the plasma generated over the complete length of the tube, with the result that each of tubes 32, 33, 34 is filled with a high-density microwave plasma. In this case, a separate microwave waveguide having a circulator, tuning elements and a magnetron may be associated with each tube 32, 33, 34, but it may be desired if only one microwave waveguide of this kind which branches at its end into tubes 32, 33, 34, in particular in a rotationally symmetrical manner via waveguide branches is provided. In the embodiment according to FIG. 2a, in this case, for example eight branches from the main waveguide are provided with downstream waveguide parts which branch away symmetrically from the center and thus inject the desired microwave radiation into tubes 32, 33, 34.

Figure 4:
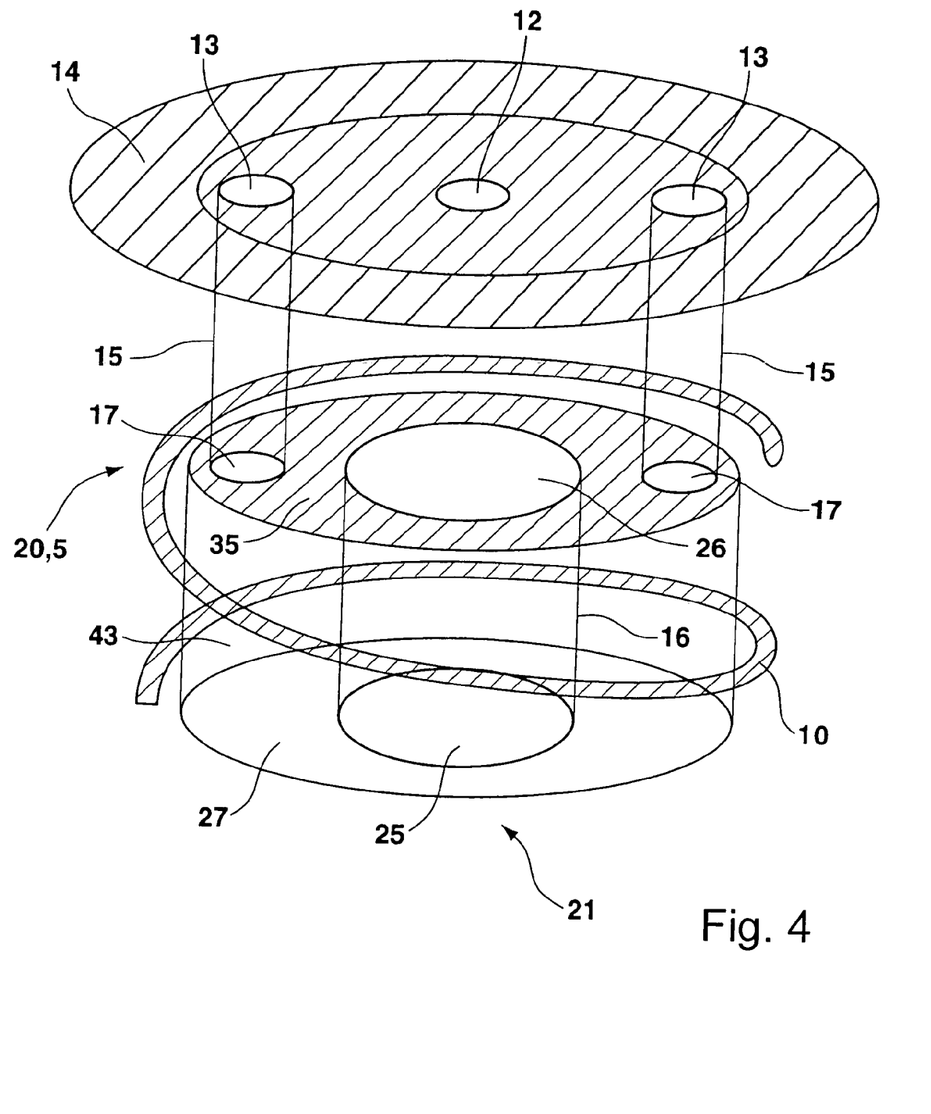
FIG. 4 shows a fourth embodiment of the insert body.

FIG. 4 shows a fourth exemplary embodiment of the present invention. In this case, a vertical separation of the plasma etching device into an upper zone 42, which may be a passivation gas zone, and a lower zone 43 underneath, which may be an etching gas zone, is provided, which may be by a horizontal partition wall 35 inserted into insert body 5 approximately half way up in the region of the plasma source. Upper zone 42 thus corresponds to a passivation gas zone 22 according to FIG. 1a, 2a or 3a, while lower zone 43 corresponds to an etching gas zone according to FIG. 1a, FIG. 2a or FIG. 3a.

Furthermore, the gas broken up by the action of plasma in upper zone 42 is supplied to process chamber 53 through a bore or a central bore, acting as upper gas exit opening 26 in horizontal partition wall 35 having an exit tube attached to it acting as lower gas guide 16, i.e., the gas flows only through lower zone 43 without coming into contact with the gas supplied thereto and thus reaches mixing region 21.

The etching gas is supplied from above to lower zone 43, for example, via one or a plurality of, for example two or four, leadthroughs or upper gas guides 15 and associated lower gas entry openings 17 in partition wall 35, these may be passing through upper zone 42 without the gas guided therein coming into contact with the gas in upper zone 42, and the diameter of upper gas guides 15 which may be chosen to be narrow enough that no parasitic plasma is ignited in them as it is guided through upper zone 42. The etching gas broken up in lower zone 43 by the plasma acting on it then passes on into process chamber 53 through an exit screen 27 which is situated, for example, around an exit tube used as a lower gas guide 16, and in process chamber 53 it blends for the first time with the gas emerging from lower gas guide 16.

Moreover, it should be emphasized that the association of the etching gas and the passivation gas with upper zone 42 and lower zone 43, respectively, the functions of which correspond to etching gas zone 23 and passivation gas zone 22, respectively, according to FIGS. 1a to 3b, may also be interchanged in the exemplary embodiment above; i.e., it is also possible for the passivation gas to be supplied to lower zone 43 and the etching gas to be supplied to upper zone 42.

FIG. 4 furthermore shows that coil 10 is laid around upper zone 42 and lower zone 43, in this case may have two or more windings. This ensures that sufficient high-frequency power for the operation of an inductive plasma is fed into both lower and upper zone 42, 43. Ignition of the plasma in upper and lower zones 42, 43 is unproblematic, since both are directly adjacent to coil 10 and the electrical/capacitive action provides sufficient pre-ionization for an inductively coupled plasma.

As the material for an insert body 5 according to FIG. 4, having upper zone 42 and lower zone 43 and gas guides 15, 16 integrated in them, primarily ceramic or quartz glass are suitable, quartz glass being easier to process.

According to FIG. 4, etching gas and passivation gas are once again supplied to insert body 5 via cover plate 14, which has gas entry openings 12, 13 which supply the particular gas to upper zone 42 or to upper gas guides 15 leading to lower zone 43. Once again, O rings against the end faces, for example, are used as seals. According to FIG. 4, insert body 5 is attached at the lower end to the process chamber once again, for example, via a base plate (not illustrated in FIG. 4), the bore of which may correspond to the internal diameter of lower zone 43. Here again, an O ring against the end face of the reactor wall may be used as a seal.

Because the design of the insert according to FIG. 4 is relatively complex by comparison with FIG. 1a, 2a or 3a, it is may be less desirable than those.

In performing an anisotropic plasma etching of silicon, for example, in order to generate trenches which are as vertical and smooth as possible, using one of the devices described above, it is possible to a very large extent to make use of the formulations from German patent document no. 42 41 045. In particular, the inductively coupled electrical outputs at coil 10 are between 400 watts and 6 kilowatts, and the output at the substrate electrode is between 5 and 30 watts, averaged over time, as a result of which ions which are generated are accelerated towards the substrate to be etched. Furthermore, both in the case of the coil output and the substrate electrode outputs, pulse techniques according to DE 199 33 842 Al or magnetic fields in the range of a few mTesla according to DE 199 33 841 Al or the application DE 100 51 831.1 may be used.

The process pressures in the plasma etching device are between 10 μbar and 300 μbar, which may be between 30 μbar and 150 μbar, in particular 45 μbar to 90 μbar. At the same time, depending on the adjustment of the gas flows in individual etching gas zones 23, 43 or passivation gas zones 22, 42, different pressures may also arise, i.e., the pressure given relates to mixing region 21 in the plasma etching device and not to the pressures in tubes 15, 16, 32, 33, 34 or zones 22, 23, 42, 43 containing etching gas or passivation gas.

The gas flows introduced are for example 100 sccm to 2000 sccm (cm$^3$/min at a standard pressure of 1 bar) of $SF_6$ for the etching gas, in particular 500 sccm of $SF_6$, to which a portion of oxygen amounting to 10% to 20% may be added, and 10 sccm to 1000 sccm of $C_4F_8$ for the passivation gas, in particular 30 sccm to 250 sccm of $C_4F_8$, to which a portion of oxygen amounting to at most 2% may be added. If the gas flow rates for the etching gas and passivation gas are set to be markedly different from one another, it is also possible to generate sharply different pressures in etching gas zones 23, 43 from those in passivation gas zones 22, 42, i.e., one possibility is to use this for each species (etching species, passivation gas species) to adjust the ideal pressure in associated zones 22, 23, 42, 43 for their generation under the given output parameters.

Moreover, the substrate temperature may be −30° C. to +100° C., for example +50° C. In all cases, it should be limited to values below 100° C. in order to maintain the stability of photoresist masks.

Under the process conditions described above, it is generally advantageous if a quantity as large as possible of free fluorine radicals is provided, since these drive the etching of silicon. Accordingly, a gas flow as large as possible of fluorine-donating etching gases is sought, for example 300 sccm to 1000 sccm of $SF_6$, $ClF_3$, $F_2$ or other gases, so that a large quantity of fluorine radicals is obtained together with an injected plasma power as high as possible, of for example 3 kilowatts to 5.5 kilowatts. In addition, however, a certain quantity of polymer-forming species is also required for sidewall passivation: otherwise, however, the passivation gas is not really desirable, since it always dilutes the etching species present and moreover may also neutralize it as a result of radical-capturing reactions. Here, it must be taken into account that not only polymer-forming monomers, i.e., the species activated in the plasma, may act as recombination partners but also and primarily unexcited passivation gas molecules which in the related art usually make up the majority of the passivation gas supplied, typically 80% to 95%. These passivation gas molecules are not activated by the plasma in the related art but pass through the plasma generation zone without being activated. Consequently, a gas flow which is as low as possible but is still sufficient to passivate or to ensure a sufficient number of polymer-forming monomers is desirable in order to minimize losses through recombination.

This may be achieved by the use of more readily polymerizable passivation gases than $C_4F_8$, such as $C_4F_6$ or $C_5F_8$, and/or by supplying an at least approximately fixed proportion of the power introduced into the plasma from the plasma source to the passivation gas which is supplied to plasma etching system 70 and in particular to the plasma source, regardless of the passivation gas flow.

This independence between the plasma power supplied to the passivation gas and the passivation gas flow in the region of the plasma source makes it possible to expose the passivation gas to extremely intensive plasma excitation even at a relatively small passivation gas flow, and hence to achieve a significantly higher crack rate, i.e., a significantly higher proportion of passivation gas molecules actually activated in the plasma. In this way, with a passivation gas flow of, for example, only 40 sccm of $C_4F_8$, a quantity of polymer-forming monomers may be generated similar to that only achievable by a method according to U.S. Pat. No. 5,498,312, using a gas flow as high as 200 sccm or more.

This input of power into the passivation gas in a manner irrespective of the passivation gas flow, and the very efficient formation of passivation gas molecules activated in the plasma, are achieved using the multiple pole system described above in that the plasma power provided for one gas type is chiefly determined by the geometry of the individual excitation zones, i.e., etching gas zones 23 and passivation gas zones 22, and is broadly speaking independent of the gas flow of the particular gas type. This means that in the case of, for example, a constant gas composition during the process, the two parameters of gas flow of one type and plasma power applicable to the particular gas type are made independent of one another, which greatly increases the possibilities of optimization and, as stated, makes it possible to implement processes with a steady-state gas composition and minimal losses through recombination with much reduced passivation gas flows.

In this context, the magnetic coil system below the plasma source or reaction region 20, in the form of a multiple-pole plasma generation zone, known from DE 100 51 831 Al is also very advantageous because, in addition to making the ion and radical flows towards substrate 59 being processed homogeneous, it brings about a further increase in efficiency of the plasma source precisely with steady-state gas composition. A magnetic plasma support of this kind greatly promotes the activation of passivation gas species even at low passivation gas flow rates, so that overall a crack rate of 50% to 90% may be achieved.

Figure 5A:
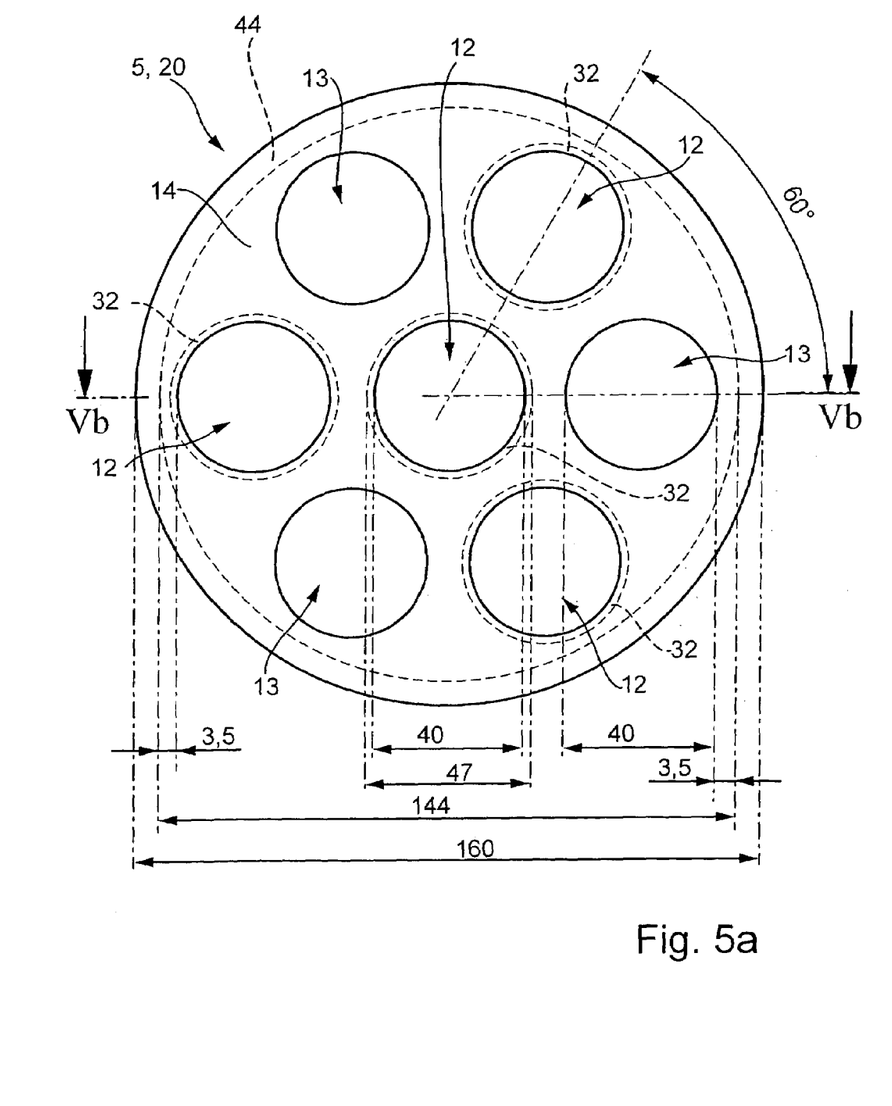
FIG. 5a shows a top view of a further embodiment of the insert body.
Figure 5B:
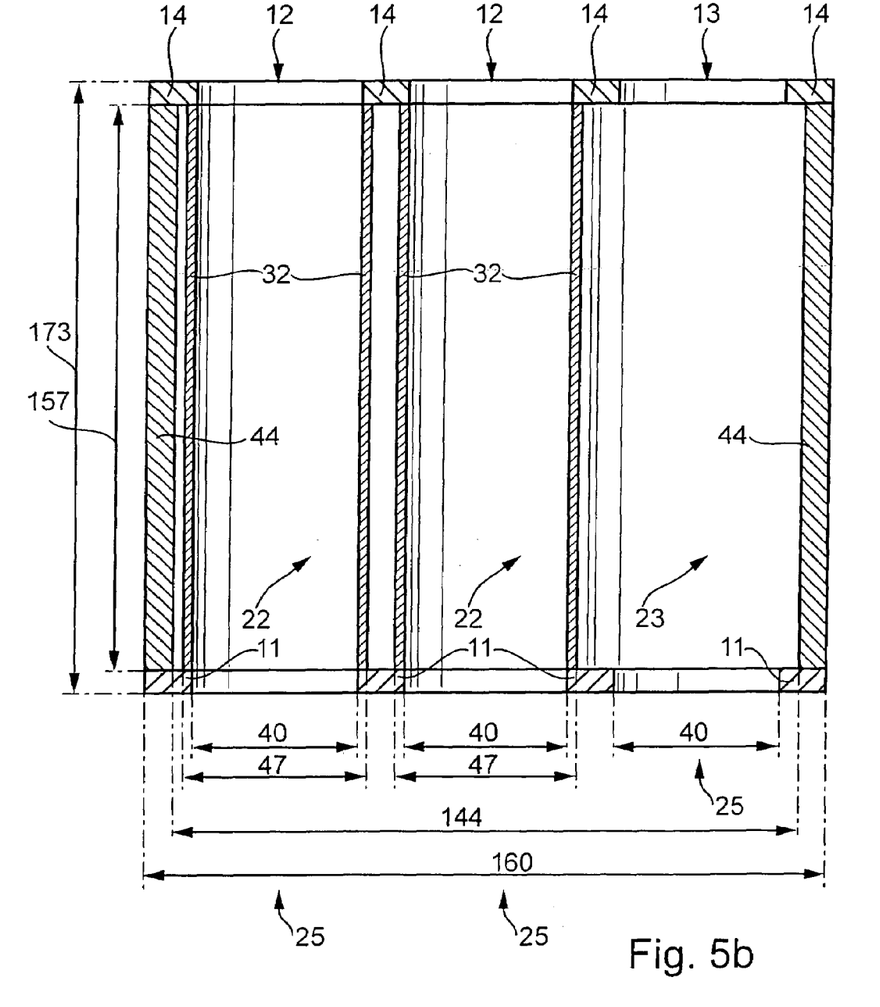
FIG. 5b shows a section through FIG. 5a along the section plane shown in the drawing.

In this context, FIG. 5a and FIG. 5b show a further insert body 5 providing an alternative to the one in FIGS. 1a through 4. FIGS. 5a and 5b are labeled with dimensions in millimeters, given by way of example, and are drawn largely to scale.

Going into detail, FIG. 5a shows a top view of a reactor or insert body 5 made of ceramic or, which may be, quartz glass, which may have a cylindrical outer wall 44 into which four tubes are inserted, acting as passivation gas guide tubes 32. Within the reactor, a plasma is maintained, which may be by inductive excitation and which may use magnetic support of the type referred to in German patent document no. 100 51 831, in which case the etching gas, which may be $SF_6$, is supplied to the volume of the reactor interior not occupied by the passivation gas guide tubes 32. The passivation gas, which may be $C_4F_8$, $C_3F_6$, $C_4F_6$ or $C_5F_8$, is supplied to passivation gas guide tubes 32 and a plasma discharge is also induced within it.

As is clear from the dimensions of the reactor and four tubes 32 which are given in millimeters in FIG. 5a, regardless of the gas flows, approximately ⅓ of the total power supplied goes to tubes 32 through which passivation gas flows, while approximately ⅔ of the total power supplied goes to the region outside tubes 32. This means that, for example with a plasma output of 3600 watts, an amount of approximately 1200 watts goes to the passivation component (regardless of the passivation gas flow) and an amount of approximately 2400 watts goes to the etching component (regardless of the etching gas flow). FIG. 5b shows in cross-section how tubes 32 are set up in reactor 5. Furthermore, gas entry opening 12 provided for the passivation gas, in the region of cover plate 14, and gas entry openings 13 for the etching gas are visible. Thus, during operation, passivation gas zones 22 form in the interior of tubes 32 through which passivation gas flows, and an etching gas zone 23 forms in the rest of the volume of reactor 5. Gas exit openings 25 are provided in the lower part of the reactor.

Of course, systems other than the one indicated by way of example for insert body 5 are also suitable. For example, instead of a reactor, a number of tubes 32, 33 situated next to one another may also be provided as plasma generation chambers, the number of etching gas guide tubes 33 and passivation gas guide tubes 32 providing a regulation of the division of the plasma power supplied between the particular process components regardless of the actual gas flows. All that is important is that the passivation gas and the etching gas are each assigned a separate volume in reaction region 20, which is predefined by the apparatus. Consequently, it is also readily possible, based on FIG. 4 and having insert body 5 divided vertically into two plasma generation zones 42, 43, to supply the latter with different levels of power and hence to make the desired division independently of the actual gas flows, establishing it by choosing the generator output associated with each of zones 42, 43.

The system according to FIG. 5a and FIG. 5b is advantageous in particular because it is still close to the standard for conventional etching systems and requires only one high-frequency generator 54 for coil 10 and only one coil 10 for plasma generation. Otherwise, insert body 5 has a relatively small internal diameter of 100 mm to 150 mm, for example 144 mm, which results in a particularly high power density in the interior, makes the plasma particularly stable and increases the efficiency of the molecular excitation, in particular in relation to the passivation gas.

Figure 6:
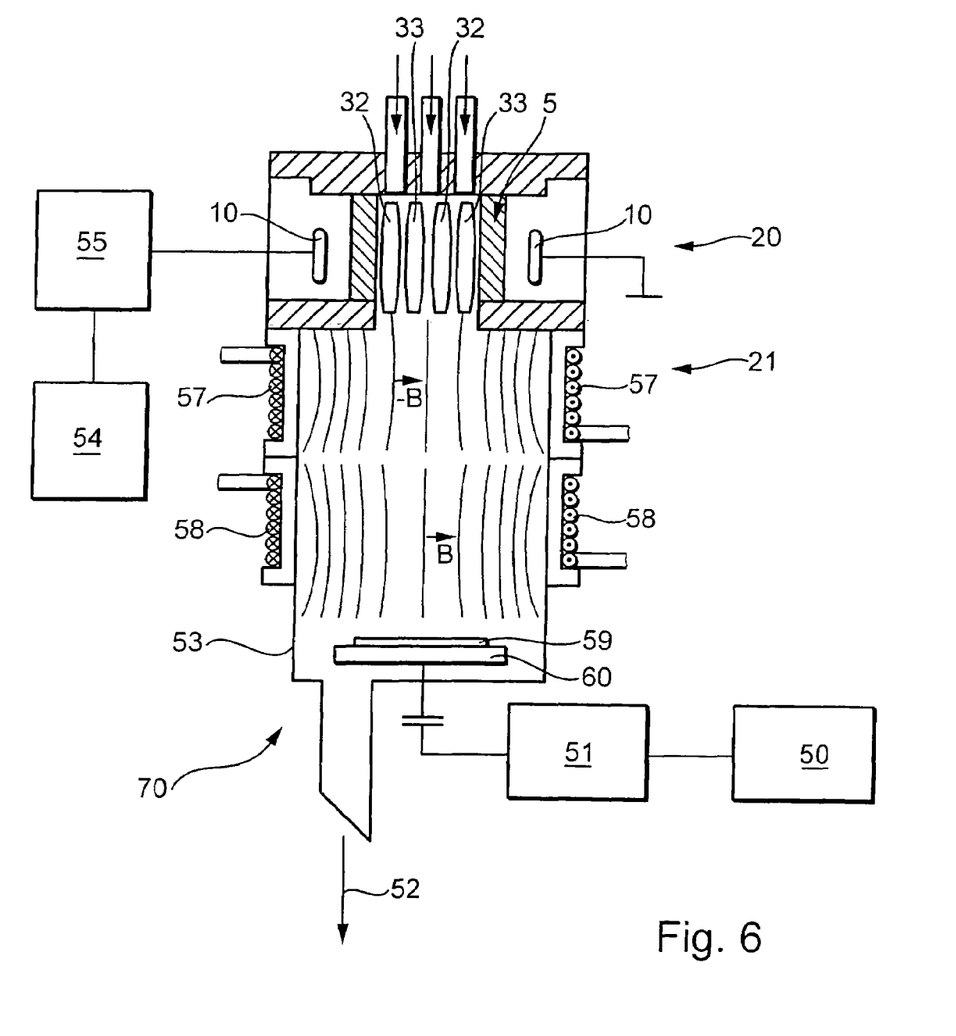
FIG. 6 shows a schematic diagram of a plasma etching system.

FIG. 6 shows a schematic diagram of a plasma etching system 70 which is largely known from DE 100 51 831 A1 and has a substrate bias generator 50, a first matching network 51 ("matchbox") associated with the latter, a chamber 53, an outgoing gas line 52 which is connected to high-performance vacuum pumps, a substrate electrode 60 on which a substrate 59 such as a silicon wafer, for example, is located during operation, a coil generator 54, a second matching network ("matchbox") associated with the latter, a coil 10 for generating an inductively coupled plasma, and insert body 5 according to one of the exemplary embodiments described. Insert body 5 or reactor is furthermore located in reaction region 20, downstream of which is mixing region 21 in the interior of chamber 53. Finally, in FIG. 6 there is provided an upper coil 57 surrounding chamber 53 in certain regions and a corresponding lower coil 58, and these each generate a magnetic field in the interior of chamber 53, facing one another. A process formulation which may be implemented using this plasma etching system 70 when etching trenches in silicon is as follows:

| | |
|---|---|
| Etching gas and etching gas flow: | 500 sccm of $SF_6$ |
| Passivation gas and passivation gas flow: | 30 sccm of $C_4F_8$ or $C_3F_6$ |
| Process pressure within chamber 53 in the substrate region: | 70 μbar |
| Plasma source output (with a high frequency of 13.56 MHz): | 2700 W to 5500 W |
| Current of upper coil 57 (420 windings, 40 cm in diameter): | 7.5 A |
| Current of lower coil 58 (360 windings, 40 cm in diameter): | 5.5 A |

Furthermore, a high-frequency output (for example using a carrier frequency of 13.56 MHz) may be supplied to substrate electrode 60 in double-pulse operation according to DE 199 57 169 A1, with a peak output of 500 watts, a pulse repetition rate of 100 kHz at a 10% duty cycle and an additional slow pulse at, for example, 40 Hz at a 50% duty cycle, which means there is an effective output at substrate electrode 60 of 20 to 25 watts.

If it is desired to dispense with this double-pulse technique and to act on the substrate electrode using an unpulsed high-frequency output (for example having a carrier frequency of 13.56 MHz), the result is a modified process formulation:

| | |
|---|---|
| Etching gas and etching gas flow: | 500 sccm of $SF_6$ |
| Passivation gas and passivation gas flow: | 50 sccm of $C_4F_8$ or $C_3F_6$ |
| Process pressure within chamber 53 in the substrate region: | 45 μbar |
| Plasma source output (having a high frequency of 13.56 MHz): | 2700 W to 5500 W |
| Current of upper coil 57 (420 windings, 40 cm in diameter): | 7.5 A |
| Current of lower coil 58 (360 windings, 40 cm in diameter): | 5.5 A |

In this case, an effective bias output of 15 watts continues to be injected into substrate electrode 60.

In the event of the first process formulation, a smaller passivation gas flow than that in the second formulation is sufficient, since the double-pulse technique used significantly increases the efficiency of the side wall passivation sought. In particular, periodic phases without ion bombardment and the improved passivation efficiency induced thereby have the result that a smaller number of passivation species is sufficient for the passivation, which in turn brings about smaller losses through recombination.

Other process formulations may be directly derived herefrom in particular through a modified division of the volumes available to the passivation gas and the etching gas in the region of the plasma source or reaction region 20.

Figure 7:
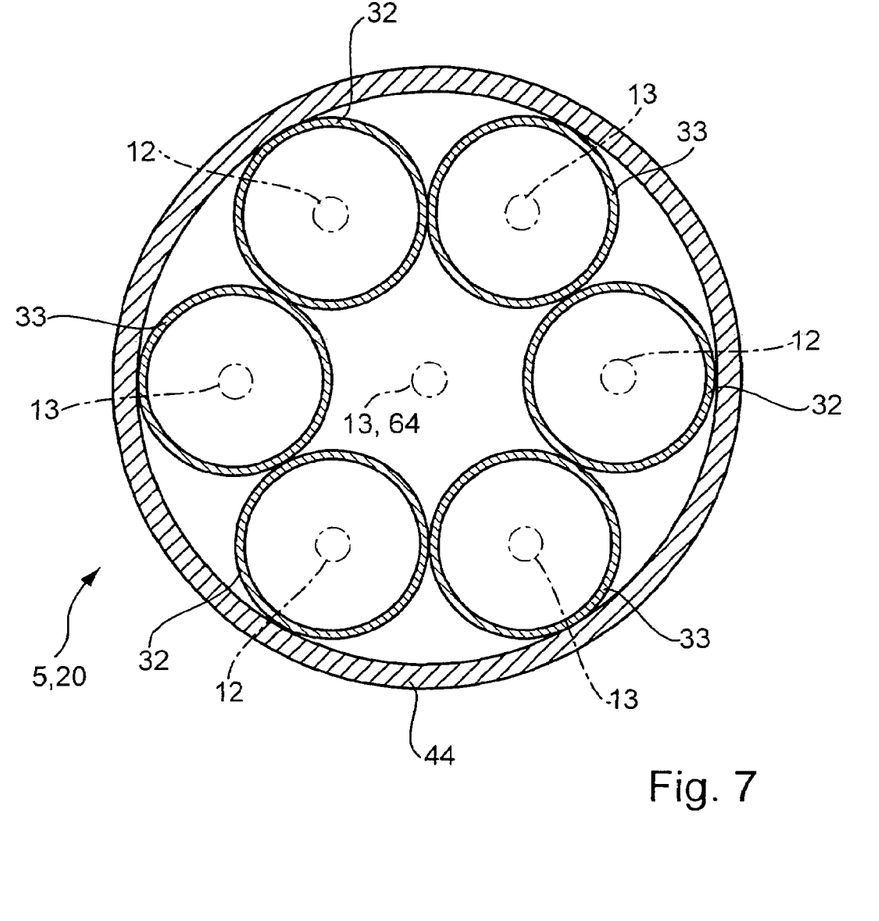

FIG. 7 illustrates a further exemplary embodiment of an insert body 5, which is constructed as a cylindrical reactor made of quartz glass or ceramic and has an external diameter of, for example, 160 mm and an internal diameter of, for example 130 mm. Furthermore, a system of, for example, six tubes 32, 33 each having an external diameter of 42 mm and a wall thickness of 3 mm is set up in this reactor, with the result that six individual chambers are formed, of which in the example described three are acted upon using etching gas and three using passivation gas. Hence, three passivation gas zones 22 and three etching gas zones 23 are created in the interior of tubes 32, 33. Because quartz tubes undergo some etching as a result of the plasma chemistry, they have to be replaced regularly and are thus consumables. Of course, another, in particular a larger, number of tubes 32, 33 may also be used, however. In FIG. 7, replacement of tubes 32, 33 is achievable in a simple way at low cost in particular, because they are simply pushed into the reactor and support one another toward the inside, and are supported toward the outside by the inner wall of the reactor or outer wall 44. Moreover, it is not necessary to replace the entire reactor or insert body 5 but only tubes 32, 33. Furthermore, a base plate (not illustrated) having an edge which juts out by a few millimeters is provided, and this supports the side of tubes 32, 33 facing substrate 59, and so prevents the tubes 32, 33 from falling through into chamber 53. On the side remote from the substrate 59, a gas entry opening 12, 13 is furthermore associated with each of tubes 32, 33 in the region of the cover plate. The zone in the region of center 64 of insert body 5 which is framed by tubes 32, 33 may, if necessary, also have etching gas or passivation gas flowing through it via an associated gas inlet 13 and so may also become a passivation gas zone 22 or which may be an etching gas zone 23. What is more, an additional central tube 34 may also be provided here in a manner similar to FIG. 2b, which among other things supports other tubes 32, 33.

Figure 8:
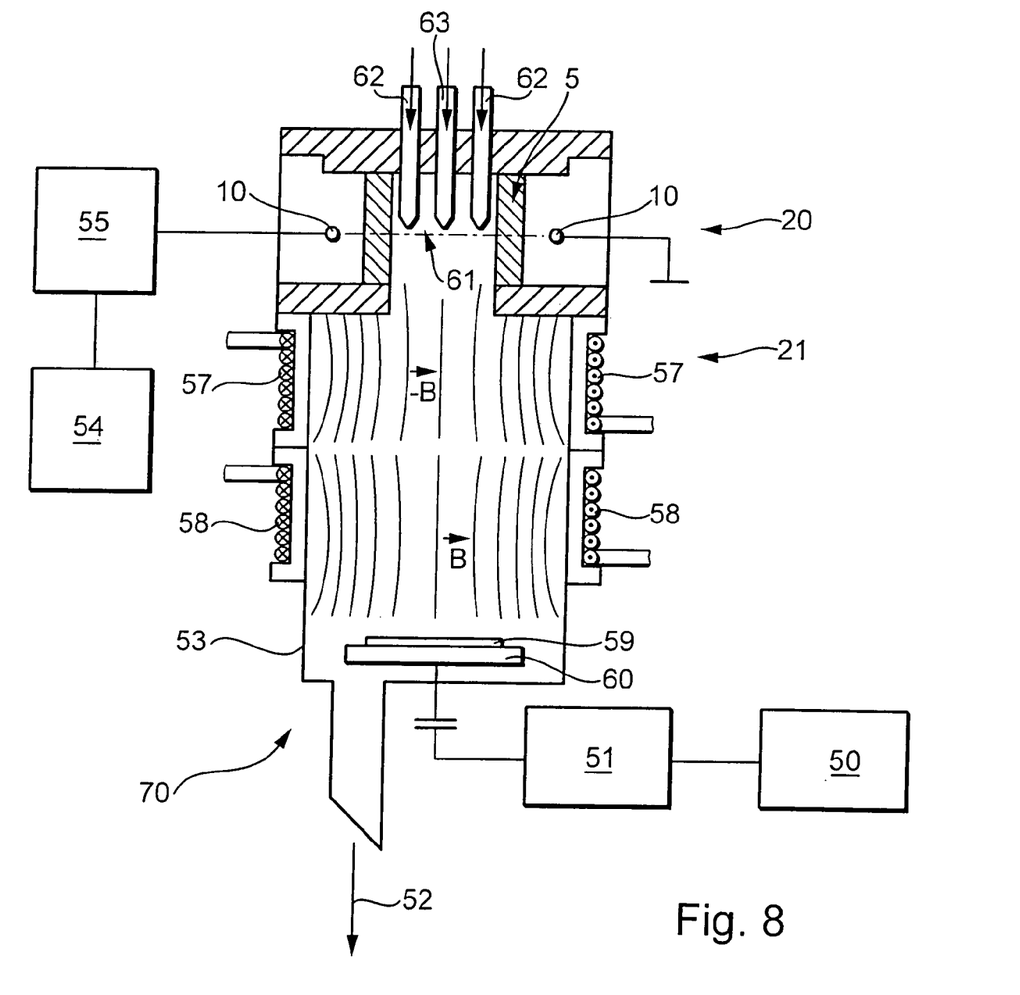
FIG. 8 shows an alternative embodiment of a plasma etching system to that in FIG. 6.

Finally, FIG. 8 illustrates a further exemplary embodiment 25 for a plasma etching system 70 in which passivation gas zones 22 and etching gas zones 23 in reaction region 20 of the plasma source are not defined by an insert body 5 but by the generation of gas flows which are focused in reaction region 20 as far as possible. In this way, the use of tubes 32, 33 may also be dispensed with. Specifically, in FIG. 8, and in contrast to FIG. 6, for example there are provided lance-shaped gas guides which are divided into passivation gas lances 62 and etching gas lances 63. These may be used to inject the etching gas and passivation gas directly into the plasma source, in which case they may end approximately above a coil plane 61 defined by the coil 10.

In this way, the etching gas and passivation gas are brought into a zone having a very dense plasma and a high excitation efficiency, and also the premature blending of the two gases is suppressed already in the plasma source as a result of diffusion and a gas flow cone which inevitably widens gradually for each lance 62, 63. Thus, each gas type may be excited locally and individually by itself, without losses through recombination in the high-density plasma, plasma conditions being established which correspond largely ideally to the properties of the respective gas type and are unaffected by the particular other gas type. The directed gas flow induced by lances 62, 63 defines to an adequate extent a volume associated with the respective gas type, which according to FIGS. 1 through 5 and 7 was carried out by tubes 32, 33 or zones 42, 43 used there, before the gases are blended by flowing through the plasma source in downstream mixing region 21.

Lances 62, 63 may be in the form of small tubes or capillaries, for example made of aluminum, anodized aluminum, ceramic, glass, quartz glass or another material not attacked by the plasma chemistry. A total of at least five, which may be at least seven, lances 62, 63 may be used, it being possible for the spatial arrangement and division of the function into passivation gas lances 62 and etching gas lances 63 to correspond to the top view of the arrangement of the tubes 32, 33 or zones 22, 23 according to FIG. 1b, FIG. 2b, FIG. 3b, FIG. 5a or FIG. 7. In particular, different gas types (etching gas or passivation gas) may flow through adjacent lances 62, 63.

According to FIG. 8, an inductive coil 10 may be provided, having a single planar winding which establishes coil plane 61, inductive coil 10 may be supplied high frequency in a balanced manner according to European Patent document no. 1 062 679 and being grounded at its center. The zone of high-density plasma excitation thus extends approximately 20 mm to 30 mm above and below coil plane 61. Lances 62, 63 may end approximately 20 mm to 60 mm above coil plane 61, i.e., precisely at the edge of or slightly above the zone of the high-density plasma excitation.

If a coil 10 having a plurality of windings is used, it is first necessary to establish how far upwards the zone of high-density inductive plasma excitation extends. From this, it is possible to establish how far gas lances 62, 63 must project into chamber 53 in the region of the plasma source. In this case, lances 62, 63 should release the process gases into chamber 53 slightly above the determined zone of high-density plasma excitation so that they mix as little as possible before and in reaction region 20.

At a typical process pressure of 30 μm to 100 μm, the free path lengths of the gas molecules are within an order of magnitude of a few millimeters to approximately 10 mm. For a system of, for example seven gas lances 62, 63, the spacing between these may be approximately 50 mm, and for a larger number of evenly distributed gas lances 62, 63 it will be correspondingly smaller. The lower limit of the spacing of lances 62, 63 is around 10 mm, i.e., more than the free path lengths of the gas molecules at the pressure in question. Hence, the two gas types blend with one another on their way to or through reaction region 20 only to a small extent and widen substantially along the exit cones of lances 62, 63 through the plasma source, where they may be excited individually under conditions which are favorable for the plasma and have no losses through recombination. The desired effect of directed emergence of the gases from lances 62, 63 may be further intensified by providing relatively narrow exit cross-sections and hence relatively high exit speeds. Thus, lances 62, 63 may be in the form of tubes having an external diameter of 3 mm to 4 mm and an internal diameter of 1 mm to 2 mm, or alternatively even smaller capillaries having cross-sections significantly below 1 mm are provided in order to generate a gas flow which is as directed as possible and has a high exit speed. The more directed the exit cone from gas lances 62, 63, the less also do the individual gas types mix on their way through the high-density plasma zone or reaction region 20, and hence also the better the separation of the individual gas types from one another, which is dependent on the flow. The shape of the exit cones from lances 62, 63 may moreover be greatly influenced by the shape of the exit opening from lances 62, 63. Furthermore, undesirable turbulence or chopping in the flow may also be suppressed in this way.

As an alternative to a configuration of individual tubes 32, 33 or lances 62, 63, the individual gas exits may also be represented by a cover having a plurality of narrow exit openings in the manner of a gas showerhead which takes on the role of lances 62, 63 or insert body 5, once again adjacent exit openings which may be allowing different gas types to flow out.

A gas showerhead of this kind may be made of aluminum, anodized aluminum, ceramic, glass, quartz glass or another material not attacked by the plasma chemistry. Furthermore, in this case a network of flow channels is associated with the gas showerhead on two planes, for example this network supplying the particular gas type to the exit openings in a defined and separated manner. Finally, in this case too, it is important for the gas showerhead to be positioned at the correct spacing from the zone of high plasma excitation density, i.e., which may be 20 mm to 60 mm above coil plane 61 which may be defined by the one winding of inductive coil 10.

What is claimed is:

1. A method for anisotropically etching a substrate, the method comprising:
   generating a high-frequency electromagnetic alternating field with a plasma source, which generates a plasma having reactive species, within a chamber, in a reaction region, by an action of the alternating field on an etching gas introduced into the reaction region and a passivation gas introduced into the reaction region;
   in the reaction region, introducing the etching gas at least predominantly into a plurality of first zones, and introducing the passivation gas at least predominantly into a plurality of second zones, the etching gas zones and the passivation gas zones alternating around a circumference in the overhead view, wherein reactive etching gas species are generated in the first zones by a plasma generated there, and reactive passivation gas species are generated in the second zones by a plasma generated there; and blending the etching gas species and the passivation gas species with one another in a mixing region downstream of the reaction region before they act on the substrate.

2. The method of claim 1, wherein at least one of the following is satisfied: (i) the etching gas and the passivation gas are supplied at the same time; and (ii) a minimized quantity of passivation gas is used compared to a quantity of the etching gas.

3. The method of claim 1, wherein at least one of the following is satisfied: (i) the etching gas donates fluorine radicals when acted on by the plasma is used as an etching gas; and (ii) the passivation gas donates teflon-forming monomers when acted on by the plasma.

4. The method of claim 1, wherein an at least approximately constant proportion of energy introduced into the plasma by the plasma source is input into the passivation gas at least approximately independently of the passivation gas flow in the reaction region.

5. A device for anisotropically etching a substrate, comprising:

a plasma source to generate a high-frequency electromagnetic alternating field;

a chamber and a reaction region to generate a plasma having reactive species, within the chamber, by an action of the alternating field on an etching gas which can be introduced into the reaction region and a passivation gas which can be introduced into the reaction region; and an arrangement to permit a plurality of first zones acted upon at least predominantly by the etching gas to be defined in the reaction region and to permit a plurality of second zones acted upon at least predominantly by the passivation gas to be defined in the reaction region, wherein downstream from the reaction region, a mixing region is provided to blend the reactive species generated in the first zones from the etching gas and the reactive species generated in the second zones from the passivation gas with one another before they act on the substrate;

wherein the etching gas zones and the passivation gas zones alternate around a circumference in the overhead view, and wherein the arrangement is arranged so that the gas supplied to the first zones and the gas supplied to the second zones are spatially separated from one another before reaching the mixing region, and during which the blending of both of the gases is at least largely prevented.

6. The device of claim 5, wherein the plasma source includes an inductively coupled plasma source having a coil, which can be used to generate a plasma in the reaction region, in the first zone and the second zone.

7. The device of claim 5, wherein the arrangement includes an insert body, which is made of glass or ceramic and which delimits at least one passivation gas zone and at least one etching gas zone, the etching gas being suppliable to the etching gas zone via an assigned gas inlet, and the passivation gas being suppliable to the passivation gas zone via an assigned gas inlet.

8. The device of claim 5, wherein the arrangement includes an insert body, whose plan view is at least one of star-shaped and cylindrically symmetrical, which is integrated into the chamber or placed on the chamber, and further includes partition walls which separate the etching gas zones and the passivation gas zones from each other, the insert body being at least largely sealed by a plate having gas entry openings, on its side facing away from the substrate, and being open on its side facing the substrate.

9. The device of claim 5, wherein the etching gas zones and the passivation gas zones are situated so that, in the mixing region, the reactive etching gas species produced from the etching gas and the reactive passivation gas species produced from the passivation gas are thoroughly mixed.

10. The device of claim 5, wherein the arrangement includes an upper zone with respect to a location of the substrate and a lower zone with respect to the location of the substrate, the etching gas being suppliable to one of the zones via gas guides, and the passivation gas being suppliable to the other of the zones, so that thorough mixing of both gases or of reactive gas species generated from them by the action of plasma first occurs at least substantially in the mixing region.

11. The device of claim 5, wherein the plasma source includes a microwave source to generate a plasma in the reaction region, in the first zones and in the second zones, the microwave source having a waveguide assigned to each of the zones for injecting microwave radiation into the zones.

12. The device of claim 5, wherein the arrangement includes one of: (a) at least one of (i) at least one etching gas lance which, during operation, induces a directed gas flow of the etching gas, and (ii) at least one passivation gas lance which, during operation, induces a directed gas flow of the passivation gas; and (b) a showerhead having at least one opening for the etching gas and at least one opening for the passivation gas.

13. The device of claim 5, wherein the arrangement includes an insert body, which is made of glass or ceramic and which delimits passivation gas zones which are spatially separated from each other and etching gas zones which are spatially separated from each other, the etching gas being supplied to the etching gas zones via an assigned gas inlet, and the passivation gas being supplied to the passivation gas zones via an assigned gas inlet.

14. The device of claim 5, wherein the arrangement includes an insert body, which is integrated into the chamber or placed on the chamber, and whose plan view is cylindrically symmetrical, and which has at least two guide tubes, the etching gas being suppliable to a first part of the guide tubes defining etching gas zones, and the passivation gas being suppliable to a second part of the guide tubes defining passivation gas zones, the guide tubes having gas entry openings, defined by a cover plate, on their side facing away from the substrate, and the guide tubes being open on their side facing the substrate and opening into the mixing region.

15. The device of claim 14, wherein at least one of the following is satisfied: (i) the guide tubes are positioned concentrically around an axis of symmetry of the chamber and run parallel to one another; (ii) and a central guide tube is provided, around which the guide tubes are, concentrically situated.

16. The device of claim 5, wherein the arrangement includes an insert body, which is integrated in the chamber or placed on the chamber, and whose plan view is cylindrically symmetrical, and which has an exterior wall and a cover plate through which at least one guide tube, which defines a passivation zone, passes, the cover plate having a gas entry opening assigned to the guide tube, and the cover plate having at least one further gas entry opening, which leads into an interior of the insert body or which is connected to at least one additional guide tube, which defines an etching gas zone.

17. The device of claim 16, wherein one of the following is satisfied: (i) at least one of the guide tubes and the insert body is open on its side facing the substrate and is open into the mixing region; and (ii) the insert body has, on its side facing the substrate, a base plate having at least one gas exit opening.

* * * * *